United States Patent [19]

Staudacher

[11] Patent Number: 5,533,120
[45] Date of Patent: Jul. 2, 1996

[54] ACOUSTIC FEEDBACK CANCELLATION FOR EQUALIZED AMPLIFYING SYSTEMS

[75] Inventor: William Staudacher, Denton, Tex.

[73] Assignee: Tandy Corporation, Ft. Worth, Tex.

[21] Appl. No.: 189,883

[22] Filed: Feb. 1, 1994

[51] Int. Cl.[6] .................................................. H03G 5/00
[52] U.S. Cl. .................... 379/392; 379/389; 379/390; 379/402; 381/103; 381/98
[58] Field of Search ............................. 379/392, 391, 379/390, 387, 402, 406, 410, 389; 381/68.4, 93, 98, 110

[56] References Cited

U.S. PATENT DOCUMENTS

| | | | |
|---|---|---|---|
| 4,088,835 | 5/1978 | Thurmond et al. | 381/98 |
| 4,845,757 | 7/1989 | Wagner | 381/93 |
| 4,939,782 | 7/1990 | Gambacurta, Jr. et al. | 381/103 |
| 5,032,839 | 7/1991 | Even-Or | 307/521 |
| 5,091,952 | 2/1992 | Williamson et al. | 381/93 |
| 5,185,803 | 2/1993 | Moyski et al. | 379/390 |
| 5,359,656 | 10/1994 | Kim | 379/391 |

OTHER PUBLICATIONS

*Digital Signal Processing Applications with The TMS320 Family,* vol. 1, Edited by Kun–Shan Lin, Ph.D., Digital Signal Processing Semiconductor Group Texas Instruments, 1986, pp. 415–545.

*TeleTalker "Enhanced Telephone Amplifier" Model TEL 004,* Williams Sound Corp., 1990.

*Primary Examiner*—Jeffery Hofsass
*Assistant Examiner*—Jacques M. Saint-Surin
*Attorney, Agent, or Firm*—Stephen s. Mosher

[57] ABSTRACT

A speaker amplification system incorporates an adaptable notch filter that can dynamically adapt to the frequency of feedback oscillations caused by acoustic feedback frequency in order to remove the feedback oscillation before they are amplified above an audible level. The adaptable notch filter is implemented as an adaptable finite impulse response filter by means of a digital signal processor. The finite impulse response filter also has an adaptable convergence factor which minimizes noise introduced by the filter. A special limiting routine is used to limit the values of the finite impulse response filter coefficients to prevent the filter from "blowing up" due to large input signal disturbances. The speaker amplification system also includes circuitry which provides multiple bands of equalization, with each band being capable of amplification. The mullet-band equalizer function allows hearing impaired people to adjust the frequency response of the telephones handset speaker, to provide better intelligibility, due to a large increase in volume over normal telephone handset receivers.

21 Claims, 14 Drawing Sheets

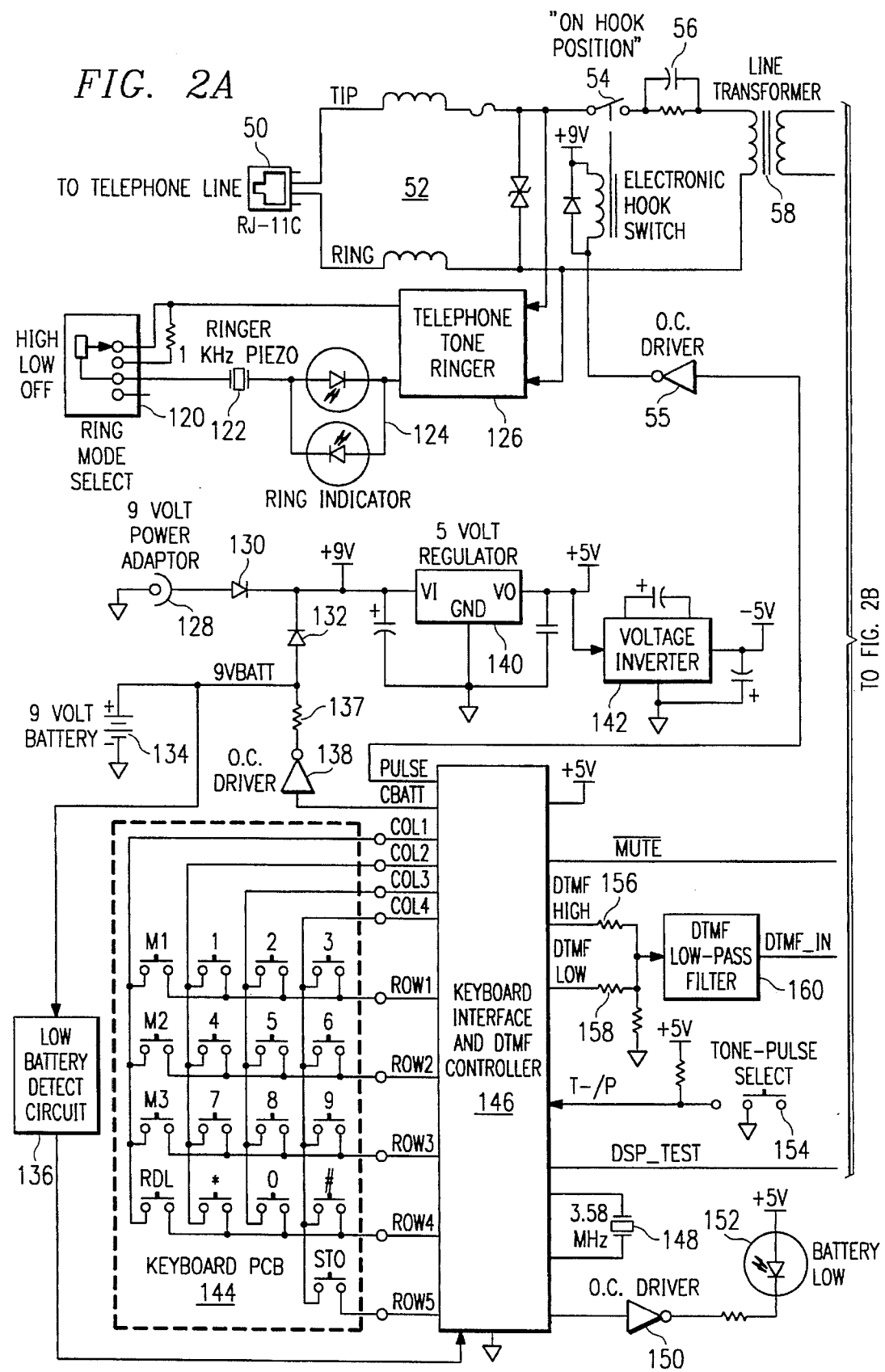

ACOUSTIC FEEDBACK CANCELLATION FOR EQUALIZED AMPLIFYING SYSTEMS

FIELD OF THE INVENTION

This invention relates generally to the field of telecommunications and, in particular, to amplification and frequency equalization of audio signals in a telephone for use by the hearing impaired.

BACKGROUND OF THE INVENTION

Research indicates that many males above the age of 65 typically have lost about 10 dB of their overall hearing capability. This hearing loss is usually frequency-dependent, for example, those with a 10 dB overall hearing impairment have often lost about 20 dB of their hearing capability for frequencies above 2000 Hz. This hearing loss may make it difficult for persons suffering from hearing impairment to use certain audio equipment such as telephone equipment.

Thus, it is obvious that, in order to meet all the needs of those who have suffered hearing loss, it is necessary to provide telephone equipment which can amplify audio signals across the whole frequency band of human speech. Such telephone equipment must provide equalization over multiple frequency bands and selective amplification, whereby a user can tailor both high and/or low frequency amplification specifically for a particular hearing need. Several prior art methods have been used to provide this amplification. These include add-on amplified speakers which can be added to existing telephone equipment and telephone equipment which incorporates its own add-on speakers.

Most of the add-on amplified speakers sold on the market today can provide a user with adjustable amplification of audio signals by means of an add-on box, coupled in the telephone cords between the telephone base unit and the telephone handset. Generally, these units can amplify the audio signal for use by hearing impaired persons, but the units generally cannot provide sufficient amplification required by severely hearing-impaired persons or required to use the telephone equipment in a very noisy environment, such as in factories or airport facilities.

Alternatively, telephone equipment which incorporates audio amplification as an integral part of the telephone, can provide sufficient amplification for all uses, but such equipment generally does not provide equalization over multiple frequency bands or selective amplification.

An additional problem in common with both add-on and integral speaker amplification units is a phenomenon known as "howling" which arises when high amplification (e.g., greater than 10 dB) is provided by the units, causing an acoustic coupling between the handset microphone and speaker. Howling is a persistent problem in a telephone system for the hearing impaired since signal amplification of about 20 dB in a frequency band of interest is generally required by the listener. If the amplification is sufficient, the coupling will cause feedback oscillation at some resonant frequency which is determined by the sensitivity of the microphone and the characteristics of the speaker. In most microphone/speaker systems, this resonant frequency will usually occur in the frequency range between 1000 and 2500 Hz. Consequently, the feedback oscillation can be heard by the user and a notch filter cannot be used to eliminate the oscillation since the oscillation frequency range overlaps the frequency band of human speech.

Attempts have been made to determine the resonant frequency for a particular microphone and speaker combination and then to use a notch filter to remove that particular frequency. However, these attempts have failed, due to the fact that harmonics of the resonant frequency will be present and the feedback will still be amplified at those harmonics. If an attempt is made to remove the lowest harmonics, a "moving target" effect occurs, where an oscillation will occur at the frequency of the lowest harmonic which is not removed up to the point where the harmonics become audibly negligible.

Therefore, it is an object of the present invention to provide an amplification system which can amplify audio signals across the whole frequency band of human speech.

It is another object of the present invention to provide an amplification system which can provide equalization over multiple frequency bands and selective amplification, whereby a user can tailor both high and/or low frequency amplification specifically for a particular hearing need.

It is still a further object of the present invention to provide an amplification system which can produce sufficient amplification for all uses.

It is still a further object of the present invention to provide an amplification system which can reduce feedback oscillation in an amplified speaker system.

SUMMARY OF THE INVENTION

The foregoing objects are achieved and the foregoing problems are overcome in one illustrative embodiment of the invention wherein a speaker amplification system incorporates an adaptable notch filter that can dynamically adapt to the feedback oscillation frequency and remove it before it is amplified above an audible level.

In accordance with one embodiment of the invention, the adaptable notch filter is implemented as an adaptable finite impulse response filter by means of a digital signal processor which can provide for up to 27 dB of acoustically coupled microphone-to-speaker feedback cancellation. The finite impulse response filter also has an adaptable convergence factor which minimizes noise introduced by the filter. A special limiting routine is used to limit the values of the finite impulse response filter coefficients to prevent the filter from "blowing up" due to large input signal disturbances.

In accordance with another embodiment of the invention, the speaker amplification system includes circuitry which provides four bands of equalization, with center frequencies at 600, 1200, 1800 and 2400 Hz with each band being capable of 20 dB of amplification. The four-band equalizer function allows hearing impaired people to adjust the frequency response of the telephones handset speaker, to provide better intelligibility, due to an increase in volume of up to +20 dB over normal telephone handset receivers.

BRIEF DESCRIPTION OF THE DRAWINGS

FIG. 2A–2C is a block schematic diagram of the telephone interface circuit including the keyboard interface, 4-Band equalizer and Digital Signal Processor circuitry.

DETAILED DESCRIPTION OF THE PREFERRED EMBODIMENT

Figure 1B:
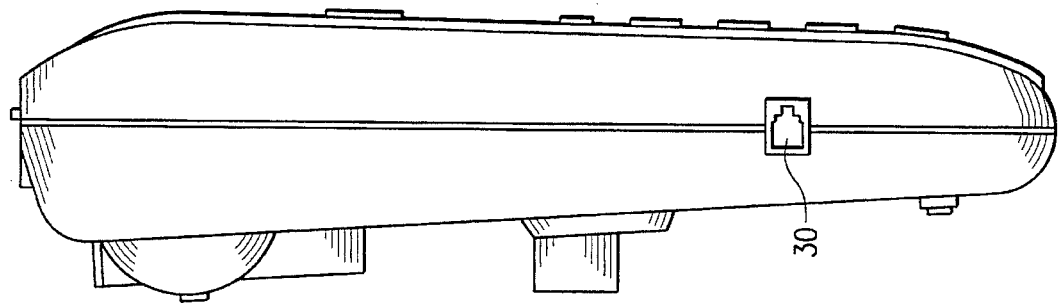
FIGS. 1A–1D are views of an illustrative telephone apparatus having a user interface which includes a keyboard interface, an equalizer on/off control and 4-Band equalizer control levers.
Figure 1A:
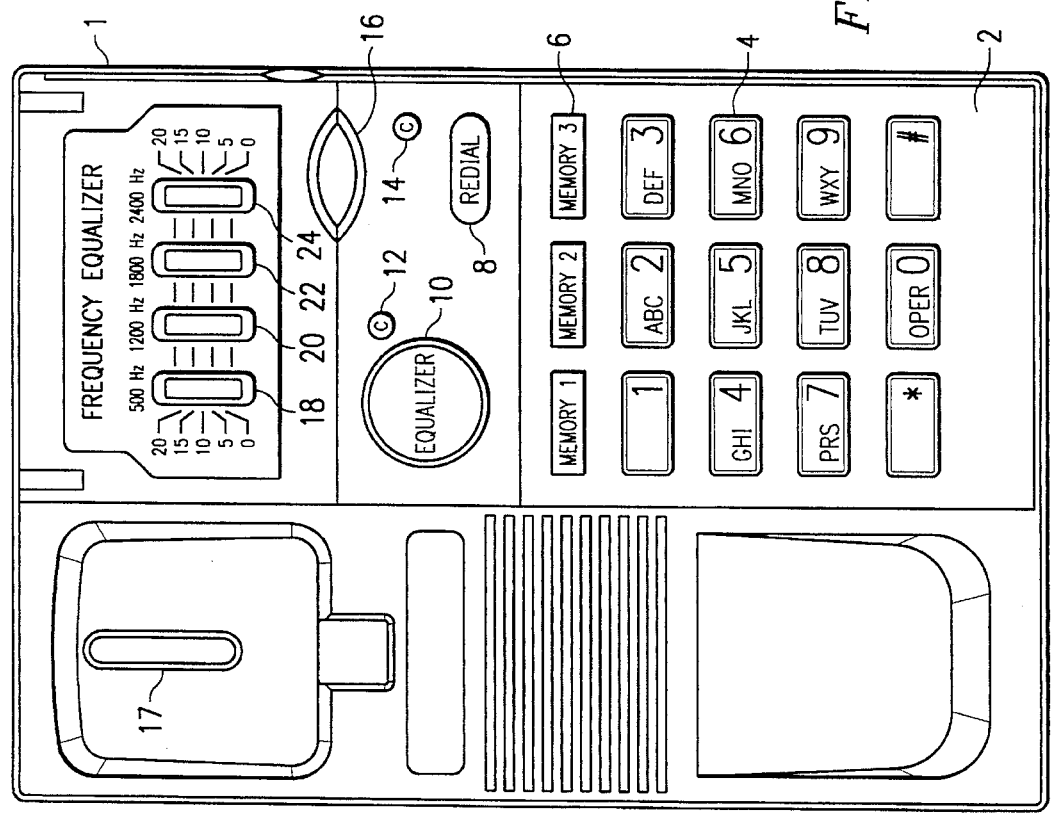
Figure 1C:
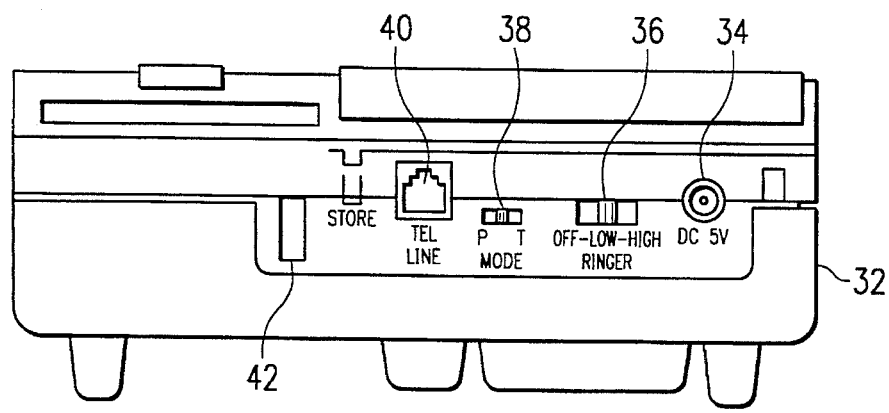

FIGS. 1A–1D are views of an illustrative communication apparatus including a user interface that incorporates an equalizer constructed in accordance with the principles of the present invention. As shown in FIG. 1A, the front panel 2 of the telephone 1 contains conventional telephone controls including a 10-digit plus "star" and "pound" keyboard interface 4, three memory storage keys 6, a redial key 8, a "low battery" led 14 and a high intensity illuminated ring indicator 16.

Figure 1D:
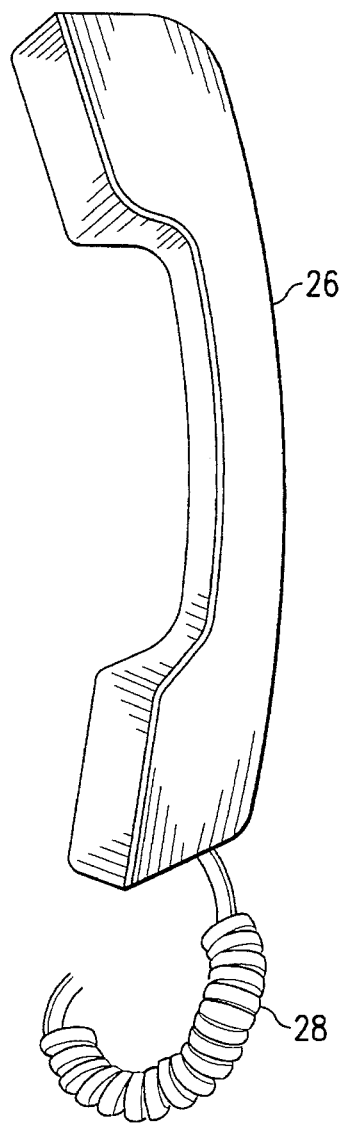

The telephone handset 26 shown in FIG. 1D, containing a microphone and speaker, is connected to the telephone handset connector 30 (FIG. 1B), via the handset 4-wire cord 28. The rear panel 36 of telephone illustrated in FIG. 1C displays a 9-volt DC power input jack 34 and a ringer volume select switch 36 (which can be set to HIGH, LOW or OFF). Also shown is a dial mode select switch 38 (which can be set to dial either in DTMF tone or Pulse-Dial mode). A telephone line is connected to the unit via connector 40 and a store switch 42 may be used to store a telephone number into MEMORY (M1, M2 or M3), for quick dial operations.

Additional controls have been added to allow the unit to operate with an equalizer employing the inventive notch filter. These additional controls are shown in FIG. 1A and include an equalizer on/off control switch 10, an equalizer "on" LED 12, a 600 Hz equalizer 18, a 1200 Hz equalizer control lever 20, an 1800 Hz equalizer control lever 22 and a 2400 Hz equalizer control lever 24.

Figure 2B:
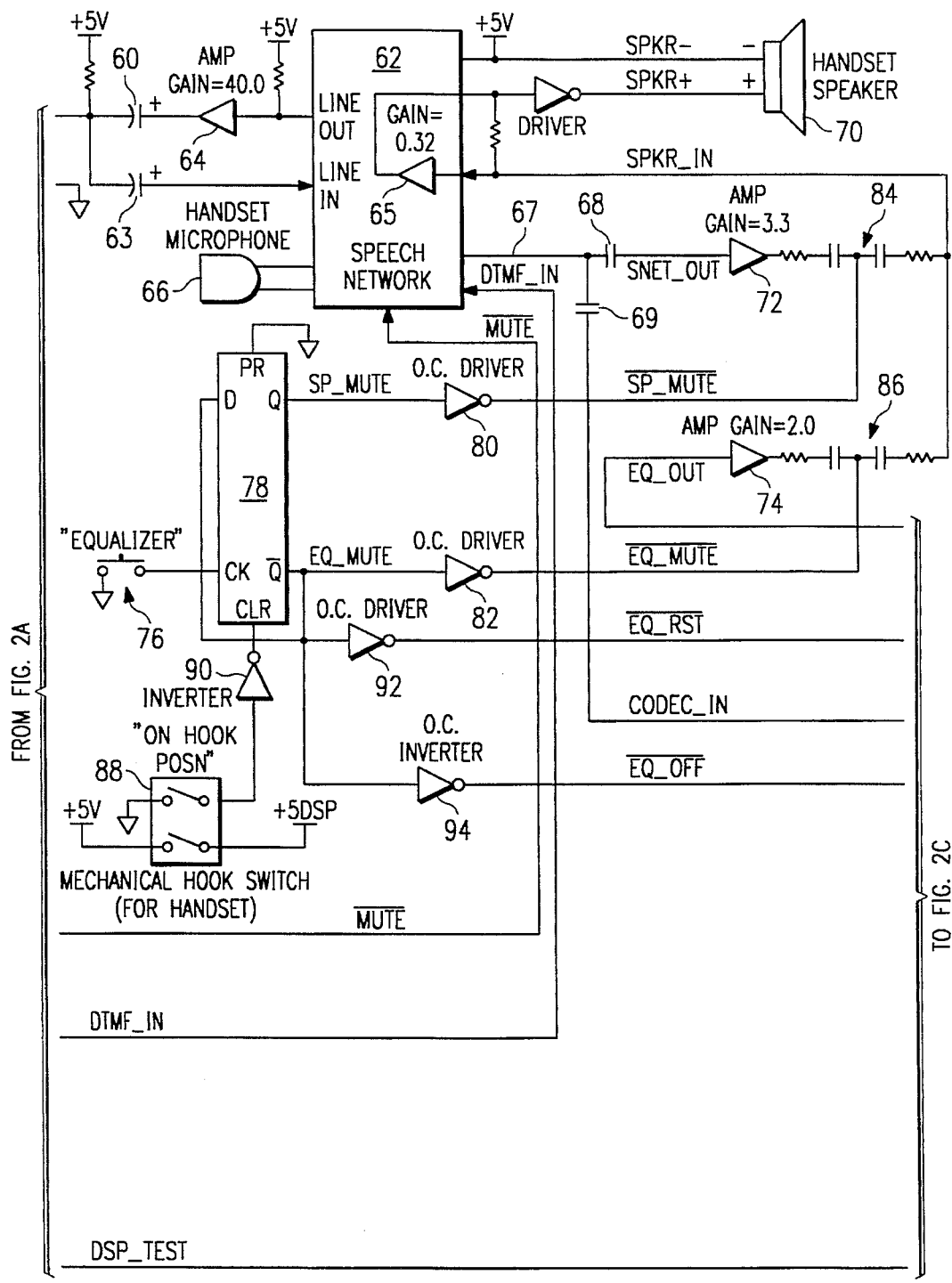

FIGS. 2A–2B is a block schematic diagram detailing the electrical connections for an illustrative communication apparatus embodying principles of the present invention. Beginning on FIG. 2A the apparatus is configured as a telephone and includes a connection from the apparatus to the tip and ring conductors of a telephone line via an RJ-11C jack 50. The tip and ring connections of jack 50 couple to a telephone line protection circuit 52, with the ring side being connected to an electronic hook switch 54. Hook switch 54 is used to connect the telephone to the telephone line in order to put the telephone "on-line" when the handset is in the "off-hook" position.

Signals on the telephone line are coupled from the electronic hook switch to a line transformer 58, through a DC/AC impedance matching circuit 56 which provides a proper termination and isolation required in a telephone line to telephone interface.

Signals on the telephone line are passed through the line transformer 58 which is AC-coupled to a speech network 62, via capacitor 63 as shown on FIG. 2B. Continuing of FIG. 2B, the speech network is a conventional circuit which contains an amplifier 65 and other circuitry for generating electrical signals which are suitable for driving the speaker circuit 70. The speech network also contains circuitry for converting electrical signals generated by microphone 66 to electrical signals for transmission on the telephone line and for coupling these latter signals to the telephone line. Signals from the telephone line that are received by speech network 62 produces a corresponding output signal at output 67.

The speech network 62 also provides audio out to the telephone line via the LINE OUT output. The output signal is provided to the line driver 64, as either an analog signal from the handset microphone 66 or as DTMF tones generated by the keyboard interface controller 146 on FIG. 2A and provided, via combining resistors 156 and 158 and low-pass filter 160 as the "DTMFIN" signal.

Returning to FIG. 2B, the line driver 64 output is AC-coupled to the line transformer 58 via capacitor 60. The speech network 62 provides "side tone" to the handset speaker, via internal circuitry to provide audible feedback to the user.

The output 67 of the speech network 62 is split into two signals, "SNETOUT" and "CODECIN", by means of capacitors 68 and 69. The SNETOUT and CODECIN signals provide the audio signal for two modes of operation of the telephone called the "Normal Mode" and the "Equalizer Mode", respectively.

Either the Normal Mode or the Equalizer Mode can be selected by means of an equalizer switch comprising switch 76 and "D Type" flip-flop 78, which combination functions as a toggle switch. In particular, each time momentary contact switch 76 is closed a ground signal is applied to the clock (CK)input of flip-flop 78. Since the Q* (in this description the "*" indicates that the signal is active in the low logic state and is equivalent to a line or "bar" over the signal. Thus, the Q and Q* outputs are inverses) output of flip-flop 78 is coupled to the D input, the flip-flop outputs change state each time the switch 76 is closed. The outputs of the D flip-flop 78 are inverses of each other, such that when the "SPMUTE" output is at a logic "1", the "EQ MUTE" output is at logic "0".

When the telephone set is initially placed in an "off-hook" condition, the mechanical hook switch 88 which is actuated by the removal of the telephone handset (26, FIG. 1D) from its cradle (17) applies a logic "0" signal to inverter 90. Inverter 90, in turn, applies a logic "1" to the clear (CLR) input of flip-flop 78. The clear signal clears flip-flop 78 so that, initially, the telephone is placed in the Normal Mode of operation. Mechanical hook switch 88 also provides power to the equalizer components (which will be described in detail hereinafter), via signal lead +5DSP, when the mechanical hook switch 88 is in the off-hook position.

In the normal mode of operation, the Q output of flip-flop 78 is at logic "0". This latter logic "0" signal is applied to open-collector (OC) driver 80 where it is inverted to generate a logic "1" SPMUTE signal. The high SPMUTE signal is applied to capacitively-coupled circuit 84 and enables the circuit to pass audio signals. Consequently, the SNET OUT signal from the speech circuit 62 is amplified by amplifier 72, passes through enabled network 84 and is applied to amplifier 65 and used to drive the speaker circuit 70. Thus audio signals from the telephone line are heard on the speaker.

In the Normal-Mode, the Q* output of flip-flop 78 will be at a logic "1" and the "EQMUTE" signal will also be at a logic "1", causing the OC driver 82 to apply a logic "0" to capacitively-coupled network 86, disabling it. Disabled network 86 mutes the audio signal which passes through the equalizer audio path. The logic "1" signal at the Q* output of flip-flop 78 is also applied to OC driver 92 which, in turn, applies a logic "0" at the EQRST* signal to the equalizer circuitry in order to reset it.

The telephone can only be placed in the Equalizer Mode by momentarily actuating switch 76, when the telephone hook switch 88 is in the "off-hook" position. When the equalizer mode is selected, network 86 is enabled and network 84 is disabled, causing the SNETOUT signal (amplified by amplifier 72) to be disconnected from the speaker circuit 70. Speaker circuit 70 is, instead, driven by the output, EQOUT of the equalizer circuit which is amplified by amplifier 74 and applied via network 86. The equalizer circuit functions to equalize the frequency response of the audio signal while also providing cancellation of any feedback oscillations that occur.

Figure 2C:
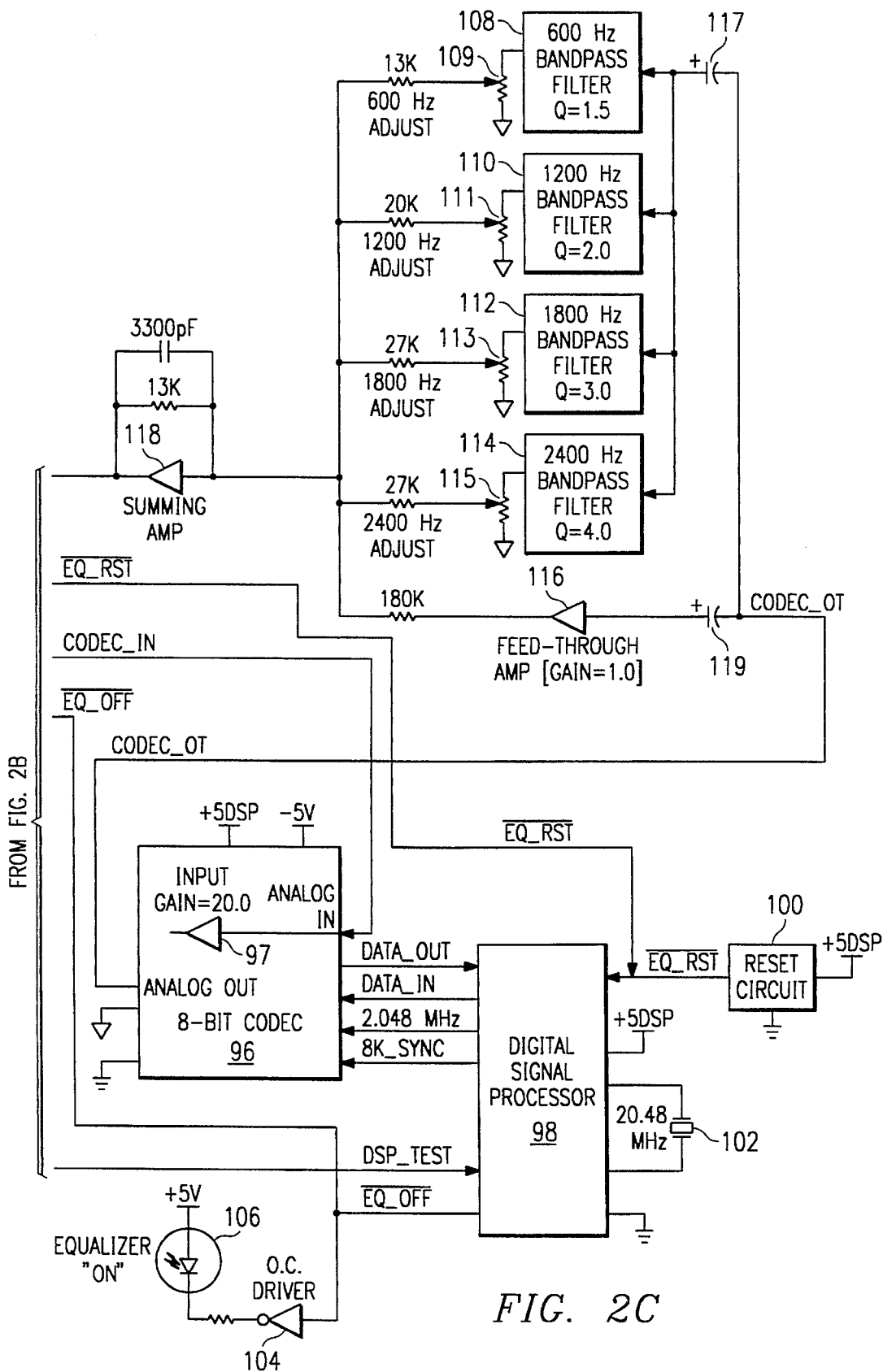

More particularly, audio from the speech network 62 is transmitted to codec 96 in FIG. 2C by the CODECIN signal, via capacitor 69. The signal at the ANALOGIN input of codec 96 is applied to input amplifier 97 which provides a gain of 20. Codec 96 is a well-known circuit which digitizes the input analog signal in the audio bandwidth (200–3400 Hz). More specifically, the input signal from input amplifier 97 is, in turn, applied to an anti-aliasing bandpass filter and an analog-to-digital converter (not shown) which converts the analog signal to a plurality of digital data words in a conventional fashion.

Continuing on FIG. 2C, the digital data words are then transmitted to Digital Signal Processor (DSP) 98 as the "DATAOUT" signal. Each data word generated by codec 96 is transmitted to the DSP 98 under control of a frame synchronization signal, "8KSYNC", provided to the codec 96 from DSP 98. The "8KSYNC" synchronization signal controls the codec 96 to provide the DSP 98 with a new 8-bit data word every 125 µS. The DSP 98 will simultaneously send processed data back to Codec 96, as the "DATAIN" signal. "DATAIN" and "DATAOUT" signal transmissions are both synchronous with a "2.048 MHz" clock, generated by DSP 98 and provided to codec 96.

The data words generated by codec 96 may illustratively be compressed before provision to DSP 98. For example the data words generated by codec 96 may be µ-255 law companded (compressed) data with a data compression ratio of 13 to 7. Illustratively, the data may be 7-bits plus one sign bit resulting in 255 code words. The DSP 98 also utilizes data companding for data decompression from µ-255 law to linear and for outgoing data compression from linear back to µ-255 law.

In any sampled data system, the analog-to-digital (A/D) conversion process introduces quantization noise because, for a conventional linear A/D encoding scheme, the digitized code word is a truncated binary representation of the actual analog sample. The effect of this truncation is most pronounced for small signals and for voice transmission, this is undesirable since most information in speech signals resides in the lower amplitudes.

Accordingly, quantization noise can be minimized by adjusting the size of the quantization step so that it is proportional to the input signal level. In this case, the quantization step is small for low amplitude signals and larger for larger amplitude signals. Consequently, lower amplitudes are represented with more quantization levels and therefore, with greater resolution. The resulting µ-255 law encoding scheme is logarithmic in nature and has the property of yielding the greatest dynamic range for a given signal-to-noise ratio and word length.

The DSP 98 processes the incoming data words to perform a variety of functions. In accordance with the principles of the invention, the DSP 98 can process the incoming data words to provide an adaptive notch filter function that suppresses feedback from acoustic coupling as will hereinafter be described in detail. There is also a provision within the DSP 98 to operate in a "Test Mode", whereby the user stores a "#" KEY into memory and the keyboard interface controller 146 (see FIG. 2A) provides a signal "DSP TEST" to the DSP 98. In response to the DSPTEST signal, the DSP 98 will then operate in a "Pass-Thru" mode, whereby no processing or feedback cancellation will be performed on the incoming signal. This mode can be used to determine the actual amount of cancellation provided by the DSP 98 and allows for testing of the frequency response of the equalizer.

The processed data words are returned to codec 96 as the DATAIN signal. The codec 96, after converting the incoming data words to an analog signal with a digital-to-analog converter, applies the analog signal to a low-pass anti-aliasing filter and generates an analog signal at its ANALOG OUT output as the "CODECOT" signal.

The CODECOT signal is then provided, via capacitors 117 and 119, to a four-band equalizer which is comprised of a 600 Hz bandpass filter 108, a 1200 Hz bandpass filter 110, an 1800 Hz bandpass filter 112, a 2400 Hz bandpass filter 114, and a feed-through amplifier 116. The feed-through amplifier 116 provides the nominal 0 dB gain signal path when all the equalizer potentiometers 109, 111, 113 and 115 are at their minimum position.

The output of the 600 Hz bandpass filter 108 is passed through the 600 Hz adjustment potentiometer 109. The output of the 1200 Hz bandpass filter 110 is passed through the 1200 Hz adjustment potentiometer 111 and the output of the 1800 Hz bandpass filter 112 is passed through the 1800 Hz adjustment potentiometer 113. The output of the 2400 Hz bandpass filter 114 is passed through the 2400 Hz adjustment potentiometer 115. These potentiometers are in their "maximum" position when their wipers are closest to the outputs of the various filters and they are in their "minimum" position when the wipers are closest to ground. The adjusted signals from the equalizer filters are all provided to the summing amplifier 118. Each input into the summing amplifier 118 is amplified by the necessary gain required to achieve a nominal of 20 dB of gain to the handset speaker circuit 70 with all potentiometers 109, 111, 113 and 115 at their maximum position.

The summing amplifier 118 output, "EQOUT", is then fed through a final gain stage 74, (FIG. 2B) which provides a gain of 2.0. The amplified and equalized signal is applied to the speech network 62 via the muting circuitry 86.

An internal DSP clock (not shown) operates with a 20.48 MHz crystal 102 and the internal clock circuitry divides the clock frequency by four, to provide the DSP 98 with an approximate 500 nanosecond instruction cycle time. A reset circuit 100 provides a clean power-up reset to the DSP 98, whenever the hook switch 88 is actuated. The reset signal, EQRST*, from OC driver 92 on FIG. 2B, (as described previously) is also removed when the telephone is placed in the Equalizer Mode, via equalizer switch 76. The removal of the reset signal provides a logic "1" EQOFF signal to the DSP 98. This signal enables the EQOFF* signal to go to a logic "1" when the DSP 98 drives the EQOFF* signal to turn on the equalizer LED 106 by means of driver 104 to indicate that equalization is taking place.

Returning to FIG. 2A, the keyboard interface controller 146 decodes signals from the keyboard 144, stores up to three telephone numbers, provides an auto-redial function, monitors the battery voltage and outputs either DTMF tones or pulse-dial pulses to the telephone line, based on the position of the "Tone-Pulse Select" switch 154. In the case of a "Low Battery" condition from the 9-volt battery 134, the low battery detect circuit 136 will prompt the keyboard interface controller 146, to flash the "Battery Low" LED 152, via OC driver 150. Also in order to properly monitor the battery voltage, the keyboard interface controller 146 will periodically place a resistive load 137 on the battery via the "CBATT" signal through an OC driver 138.

When the telephone is set to operate in the pulse-dial mode by means of switch 38 (FIG. 1C), the keyboard interface controller 146 generates "dial pulses" by pulsing the telephone line, in turn, by controlling the electronic hook switch 54, via the signal "PULSE" generated by OC driver 55. The operations of the keyboard interface controller 146 are controlled by a 3.58 MHz ceramic resonator 148.

Alternatively, when the telephone is set to DTMF tone dialing by means of the aforementioned switch 38, the keyboard interface controller 146, utilizes a pulse-width modulated output scheme whereby a DTMF high frequency signal is output to "DTMFHIGH" line and a DTMF low frequency signal is output to "DTMFLOW" line. These two signals are then passed through a DTMF lowpass filter 160 then output, via DTMFIN signal, to the speech network 62 for transmission to the telephone line as previously described. The keyboard interface controller is also responsible for "muting" the audio output of the speech network 62 via the "MUTE*" signal.

The telephone operates off of either an external 9-volt D.C. power supply adapter connected into connector 128 or by a 9-volt battery 134. Both of these voltage supplies are diode-coupled through diodes 130 and 132 to provide +9 volts to the electronic hook-switch 54 and the +5-volt regulator 140. The +5-volt regulator 140 supplies power to the associated components within the telephone. Also, since the codec 96 requires −5 volts, a +5 to −5 volt inverter 142 is used.

The telephone provides both an audible ring indication, via the 1.0 KHz piezo-ringer indicator 122, and a visible indication, via the ring indicator LEDs 124. Both indicators 122 and 124 are controlled by the telephone ringer IC 126. The loudness of the audible 1.0 KHz piezo-ringer indicator 122 is controlled by the "Ring Mode Select" switch 120 (which has three positions: "high", "low" and "off").

Figure 3:
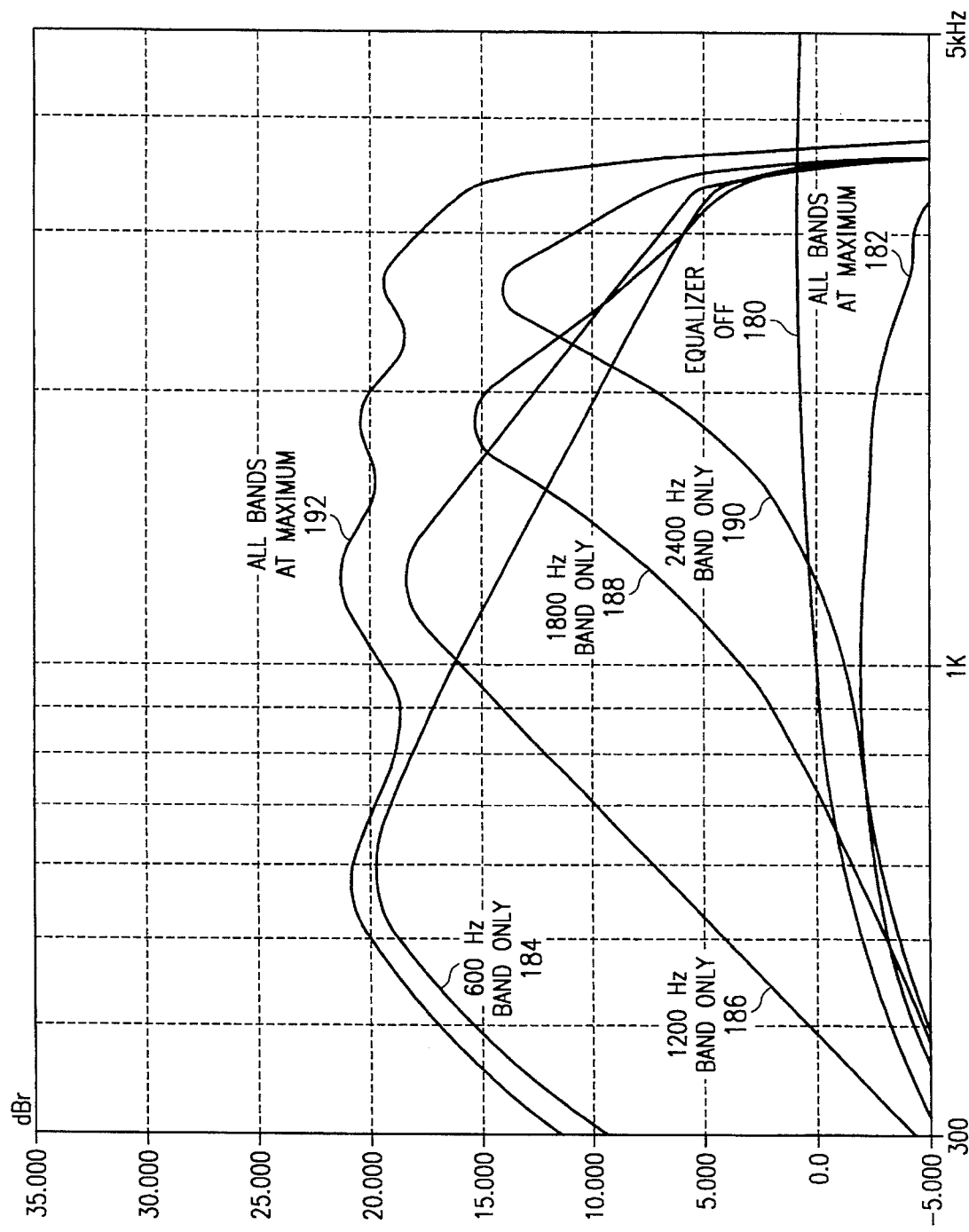
FIG. 3 illustrates the frequency response characteristics of the 4-Band Equalizer with respect to the frequency response of the telephone when the equalizer is turned off.

FIG. 3 illustrates the frequency response characteristics of the 4-band equalizer with respect to the frequency response of the telephone when the equalizer is turned off. Seven frequency response plots are shown. The EQUALIZER OFF plot 180 displays the frequency response of the telephone, when the unit is in the "Normal Mode". The ALL BANDS AT MINIMUM plot 182 displays the frequency response of the 4-band equalizer when the 600 Hz adjustment potentiometer 109, the 1200 Hz adjustment potentiometer 111, the 1800 Hz adjustment potentiometer 113 and the 2400 Hz adjustment potentiometer 115 are all at their minimum positions. The ALL BANDS AT MAXIMUM plot 192 displays the frequency response when all four adjustment potentiometers are at their maximum positions. The 600 Hz BAND ONLY plot 184 displays the frequency response when only the 600 Hz adjustment potentiometer 109 is used and set to its maximum position (all other potentiometers are set to their respective minimum positions). The 600 Hz Bandpass filter 108 was designed to have a Q of 1.5, with a 3 dB Bandwidth of 650 Hz.

The 1200 Hz BAND ONLY plot 186 displays the frequency response when the 1200 Hz adjustment potentiometer 111 is used and set to its maximum position. The 1200 Hz Bandpass filter 110 was designed to have Q of 2.0, with a 3 dB Bandwidth of 650 Hz.

The 1800 Hz BAND ONLY plot 188 displays the frequency response when the 1800 Hz adjustment potentiometer 113 is used and set to its maximum position. The 1800 Hz Bandpass filter 112 was designed to have a Q of 3.0, with a 3 dB Bandwidth of 650 Hz.

Finally, the 2400 Hz BAND ONLY plot 190 displays the frequency response when the 2400 Hz adjustment potentiometer 115 is used and set to its maximum position. The 2400 Hz Bandpass filter 114 was designed to have a Q of 4.0, with a 3 dB Bandwidth of 650 Hz.

All the frequency response curves of the equalizer display a very sharp roll-off at approximately 3.4 KHz due to the fact that the codec 96 (see FIG. 2C) contains two anti-aliasing filters designed to produce this effect.

In accordance with the principles of the invention, the DSP 98 (see FIG. 2C) is controlled by inventive routines which allow it to cancel selected signals which are generated in the system by acoustic feedback. Acoustic feedback cancellation is accomplished by providing adaptive cancellation of any steady-state periodic signal (for example, a sinusoidal tone) within the bandwidth of the codec 96. The adaptive cancellation essentially causes codec 96 to act as a notch filter where the notch frequency automatically changes to accommodate changing conditions.

Figure 4A:
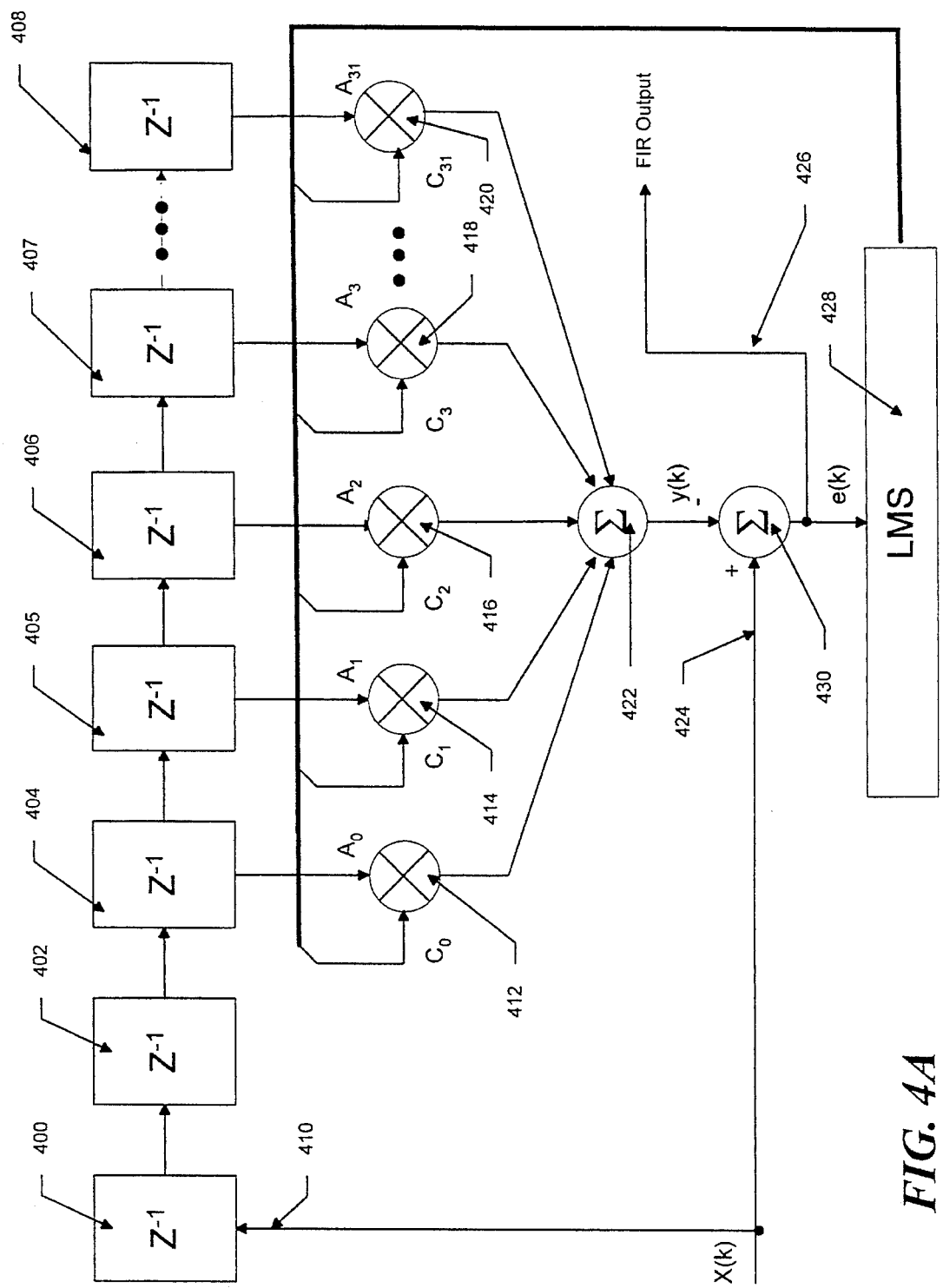
FIGS. 4A–4D are illustrative functional block diagrams of several anti-feedback cancellation routines used in the notch filter of the present invention.

FIGS. 4A–4D illustrate illustrative functional block diagrams of routines used by the DSP in accordance with the principles of the present invention in order to implement the adaptive notch filter. In particular, FIG. 4A illustrates a block diagram of a routine which implements an adaptive finite impulse response filter (AFIR) utilizing a tapped-delay-line (TDL) structure to provide adaptive coefficient adjustment. More specifically, a typical finite-impulse-response (FIR) filter is a linear filter, preferably in the form of a tapped delay line. Each tap has associated with it a "weight" which modifies the characteristic of the filter. If the delay line has only feed-forward delays, its transfer function can be expressed as a single polynomial in Z-1 and the filter's impulse response is limited to a finite number of points; therefore, it has a finite impulse response.

An adaptive finite impulse response (AFIR) filter is an FIR filter with provision for automatic adjustment of its tap weights. FIG. 4A shows an AFIR filter with a least-mean-squared (LMS) algorithm used for adapting the tap weights, which filter is used, in this example, as a feedback canceler. A received digital signal, X(k), which is typically an analog signal sampled at, or above, the Nyquist rate, is introduced to the filter at the input 410. This signal comprises both the desired voice signal plus the tone signal caused by the undesired feedback.

The input data samples provided to the AFIR are initially delayed by a 2-tap delay produced by delay units 400 and 402, which delay is small enough to maintain correlation of any undesired periodic feedback signal while also providing enough time for decorrelation of audio signals with frequencies up to 4 KHz. The selection of this 2-tap delay is based on the fact that the system has an 8 KHz sampling rate, or in other words, each sample is received at a rate of 125 μS/sample, thus the minimum de-correlation frequency (MDF) is:

$$MDF = 1/\{2*(125\ \mu S)\} = 4\ KHz$$

The AFIR is used to prevent "echoing" between the microphone and the handset speaker.

The input signal is used as a reference signal to develop an estimate of the feedback tone to be canceled and the signal is applied to successive delay units 403, 404, etc. of the AFIR filter until the "end" of the filter (delay unit 408)is reached.

Each of the delays: 400, 402, 404, 406 through 408 and any additional (but not illustrated) delays, produces a delayed version of the signal which is provided to it and the delayed signal version is passed on to the next delay unit. Illustratively, the filter is configured as a 32-tap filter, but other filter lengths could be used without affecting the operation of the invention. The delayed versions of the signal (illustrated as signals $A_0$–$A_{31}$) are also fed to multipliers 412, 414, 416, 41 8, through 420 where they are multiplied by associated tap weights $C_0$, $C_1$, $C_2$, $C_3$, through $C_{31}$. The multiplier outputs are fed into summer 422 where they are added to produce, in the case of a feedback cancellation application, the filter output which is an estimate of the feedback tone.

The feedback estimate, y(k), is subtracted from the signal X(k), which is the desired (feedback-free) signal corrupted by the feedback, by adder 430. The output of adder 430, e(k), is used as an estimate of the desired signal 426 and comprises the actual desired signal plus whatever residual error exists between the estimate of the feedback y(k), and the actual feedback signal.

The desired signal estimate e(k) is also used to modify the tap weights, that is, adapt the FIR filter, generally by means of an algorithm as shown at 428. The particular algorithm illustrated in box 428 is a conventional least mean squares (LMS) algorithm which computes the tap weight for a given interval of time and provides for coefficient adaptation.

This adaptation becomes necessary as the gain of the system, produced by the 4-band equalizer, reaches a point where feedback occurs between the microphone and the speaker. The feedback estimate, y(k), can be expressed as follows:

$$y(k) = \sum_{n=0}^{31} C_n * X(k-2-n)$$

where the (k-2-n) term is the result of the initial 2-tap delay produced by units 400 and 402 prior to the adaptive FIR filter.

The error output signal e(k) can be represented by the following equation:

$$e(k) = X(k) - y(k)$$

Figure 4B:
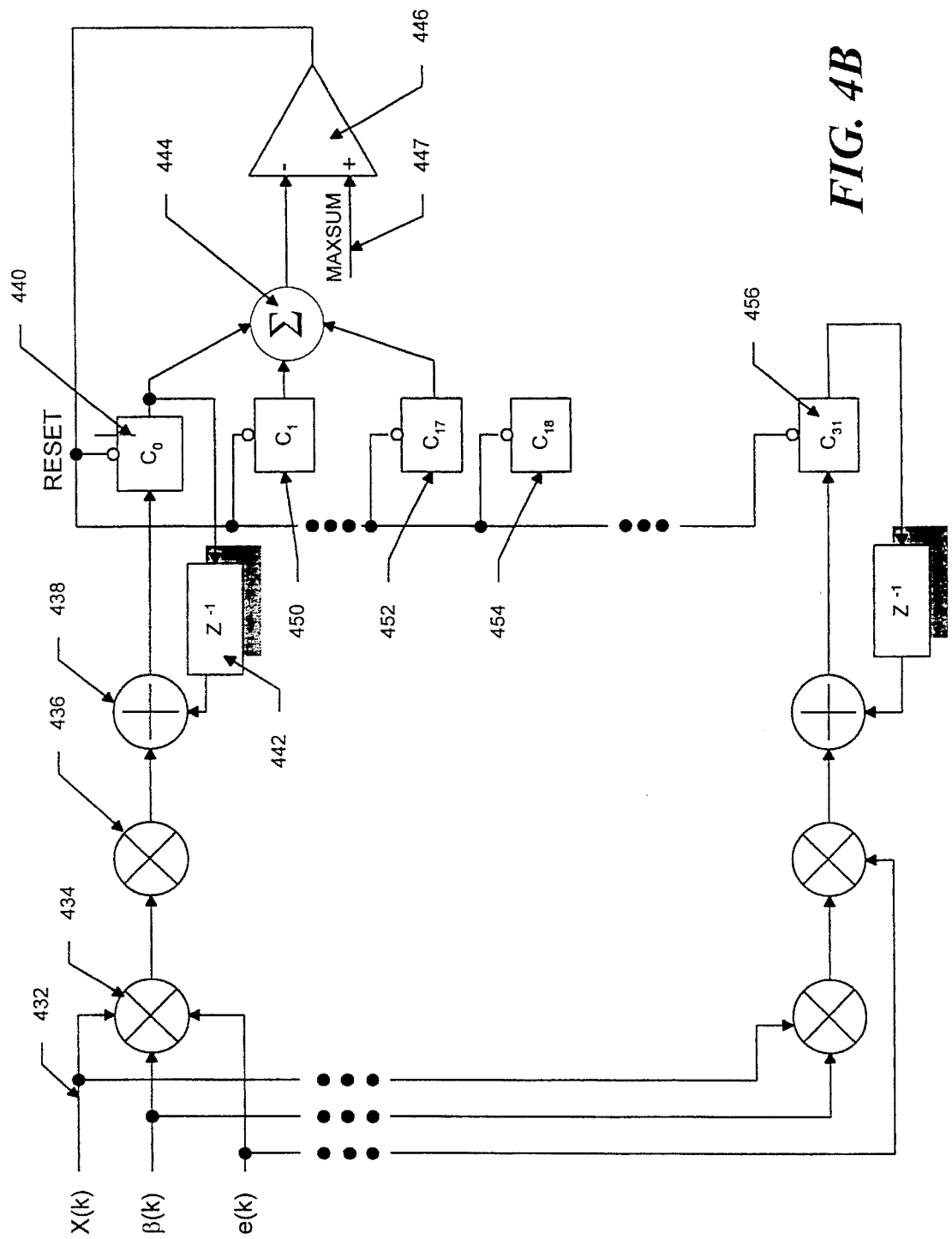
Figure 4C:
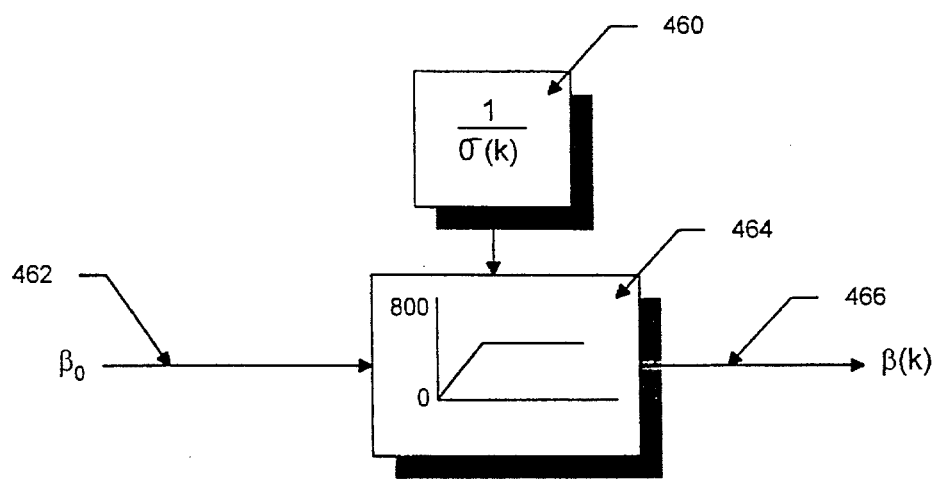

FIG. 4B illustrates the process used to both update the adaptive coefficients ($C_0$–$C_{31}$) and, in accordance with another aspect of the present invention, to also monitor the coefficients for any situation whereby, if the coefficients become too large (for example, in the case of an unstable input signal) the filter can be reset. The filter is reset by initializing the coefficients to zero so that the cancellation process will restart.

The coefficients are calculated as illustrated in FIG. 4B by providing the input signal word, X(k) on bus 432 to a digital multiplier 434. Multiplier 434 multiplies each incoming digital word by the convergence factor β(k) and the output is provided to multiplier 436. Multiplier 436, in turn, multiplies the output product of multiplier 434 by the estimation signal e(k) generated by subtracting the feedback estimate from the input signal as shown in FIG. 4A.

The resulting product is applied to digital adder 438 which adds the coefficient value stored in flip-flop 446 delayed by one word (by means of delay circuit 442). The resulting sum is stored in the first coefficient location 446 as the coefficient $C_0$. A similar calculation is performed to obtain values for the remaining coefficients $C_1$–$C_{31}$ and these latter coefficients are stored in flip-flops 450–456, respectively.

This process results in an optimum filter coefficient vector C(k), which is a 32 element vector consisting of the filter coefficients at time 'k'. The update equation for the LMS algorithm can be expressed as:

$$C(k) = C(k-1) + [\beta(k)*e(k)*X(k)]$$

where β(k) denotes the loop-gain factor (also called a convergence parameter). The adaptive process forces the error term toward zero. When the error term is minimized, the adaptive filter impulse response is said to have converged to the impulse response of the feedback tone path. In this case the adapted finite impulse response filter acts as an adaptive notch filter which removes the periodic signal produced by the acoustic feedback.

The 32 coefficients correspond to the 32 tap FIR filter where, $$C_n(k) = [\beta(k)*X(k)*e(k)] + C_n(k-1)$$

for n= 0.31.

As the coefficients are updated, the inventive process also checks to make sure that the coefficients are not becoming too large, based upon the absolute value of the sum of the first 18 coefficients not exceeding 50% of their maximum value. As shown in FIG. 4B, the maximum coefficient value is set equal to a variable value "MAXSUM". The resultant requires that if:

$$\sum_{n=0}^{17} C_n(k) > MAXSUM$$

then all 32 coefficients are cleared to zero. This is done to prevent the coefficients from getting too large, causing the process to become unstable whenever a large audio disturbance occurs, such as disconnection of the telephone line when the unit is in an "off-hook" state.

In particular, the coefficient values stored in the coefficient data locations 446–452, corresponding to coefficient values $C_0$–$C_{17}$, are each provided to a summation circuit 444. The resulting sum is compared to the predetermined maximum value MAXSUM by comparator 446. If the sum value exceeds the predetermined maximum value, then a reset signal is generated by comparator 446 which resets all coefficient data locations 446–456 to a zero output. In this manner the filter is reset and the adaptation process restarts.

In accordance with another embodiment of the present invention, the process also utilizes an adaptive arrangement to change or adapt the loop-gain factor (convergence parameter) β(k). This latter process is shown in FIG. 40.

β(k) is used to smooth noise associated with the instantaneous error estimation used by the filter and the value of β(k) is changed based on the input power density. In particular, a predetermined constant value $\beta_0$ on bus 462 is adjusted by means of the input power density function σ (k) which is calculated as described below. This adjustment is schematically illustrated in FIG. 4(:; where the input power density 460 is applied to the loop gain constant on bus 462 linearly up to a maximum level, in accordance with graph 464. The resulting output β(k) is used in the LMS process described above. Note that the application of the input power density to change the convergence factor $\beta_0$ is limited to a predetermined constant amount. Illustratively, a stable range of 0 to 800 (hexadecimal) was chosen as the maximum variance of the convergence parameter based on the input signal RMS power σ(k). Graph 464 illustrates an exemplary method for calculating the convergence factor β (k) where:

$$\beta(k) = \beta_0 \left[ \frac{1}{\sigma(k)} \right]$$

Figure 4D:
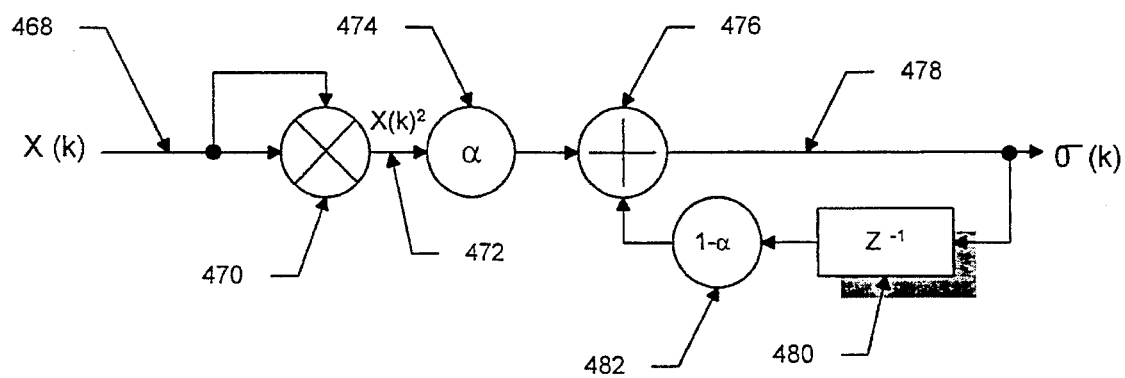

FIG. 4D illustrates one embodiment of a process for determining the input power σ(k), based on an input signal value, X(k), where:

$$\sigma(k) = \alpha * X(k)^2 + (1-\alpha) * \sigma(k-1)$$

for α= 1/16 and (1−α)= 15/16. As shown in FIG. 4D, the input power density is calculated by providing the input signal words on bus 468 to both input of a multiplier 470. The resulting product consisting if the squared input values is provided to a second multiplier which multiplies the squared input samples by the constant value α in multiplier 474. The resulting product is applied to an adder 476 whose output is the power density σ(k). The remaining input of adder 476 receives the power density delayed by one data sample (by means of delay 480) and multiplied by the constant factor 1−α (by means of multiplier 482).

FIGS. 5A through 5E, when placed together, form a flowchart of an illustrative cancellation routine which can be used to implement the processes illustrated in FIGS. 4A-4D in a DSP such as DSP 98. The routine starts in step 500 and proceeds to step 502. More particularly, upon power-up or reset, the DSP 98 will initialize memory and setup its internal registers so that, at step 502, all interrupts are disabled until all memory and registers are setup.

The routine then proceeds to step 504 where the DSP is set to use PAGE 0 of DSP RAM only (if there are two RAM banks available, with each bank having 128 words). Then the routine proceeds to step 506, where all 128 (16-bit) words of PAGE 0 of the RAM are cleared. Then in step 508, all constants used in the calculations are loaded for use.

In step 510, the DSP 98 (see FIG. 2C) performs a check to determine if it should enter "Test Mode" or "Normal Cancellation Mode". The mode selection, as previously described is controlled by a DSPTEST signal generated by the keyboard interface module (146, FIG. 2B). Consequently, in step 510 the signal input DSPTEST to DSP 98 is checked. If in step 510, the DSPTEST signal is "low", then, in step 512, the DSP 98 will debounce the DSPTEST input signal. This debounce step is necessary because the DSP TEST signal is generated from the keyboard by a mechanical switch closure and is thus subject to contact bounce.

Then, in step 514, the routine checks to see if the debounce operation is complete (the signal state is steady for a predetermined period of time). If not, then the routine returns to step 51 0 to check if the DSPTEST signal is still low. Steps 510, 512 and 514 are repeated until, upon returning to step 514, the debounce operation is indicated as complete. Upon completion of the debounce operation, the routine proceeds to step 518, where a TSTMD flag is set to indicate that the DSP is operating in Test Mode.

The routine then proceeds to step 516, where the DSP interrupts are enabled. Alternatively, in step 510, if the DSP TEST signal is high, indicating that the DSP is not in Test Mode, then the routine proceeds directly to step 516 to enable the DSP interrupts.

After the DSP interrupts are enabled, the routine proceeds, via off-page connectors 522 and 526, to step 528 where the routine remains waiting in a loop at step 528, until an "FR" framing interrupt is received by the DSP 98. The framing interrupt occurs every 125 μS, due to the fact that the sampling rate is set to 8 KHz and indicates that a new data word has been received from codec 96 by DSP 98.

When the "FR" framing interrupt occurs in step 528, the routine proceeds step 530, where a "TICKS" variable is incremented. The TICKS variable is used later in the routine for timing purposes as will be hereinafter described. Then, in step 532, the new input sample received from the codec 96 is stored in a "NEWSAM" variable and the processed output sample stored in an "ERR" variable is output to the codec 96.

Next, in step 534, the routine uses the value of the NEWSAM variable to calculate the input power of the input sample using the process illustrated in FIG. 4D. Next, in step 536, a determination is made whether the input power has increased or decreased from the previous sample. If the input power has increased, then, in step 538, a variable "BETA" (which holds the convergence parameter value, β(k)) is decreased in an amount proportional to the increase of the input power. Alternatively, if, in step 536, it is determined that the input power has decreased, the routine proceeds to step 540 where the variable BETA is increased in an amount proportional to the decrease in input power.

In either case, the routine proceeds to step 542 where a check is made to determine whether the value of the variable BETA has reached a maximum level predetermined to be a value of 800(hex). If in step 542, it is determined that the value of the variable BETA has been increased beyond 800(hex), then, in step 544, the variable BETA is set to its maximum value of 800(hex) and the routine proceeds, via off-page connectors 546 and 554, to step 558. However, if, in step 542, the value of the variable BETA is not greater than 800(hex), then the routine proceeds directly to step 558, via off-page connectors 546 and 554.

In step 558, the TSTMD flag is checked (this flag is set in step 518 as previously discussed). If the flag is set, then feedback cancellation will not be performed. Instead, in step 562, the variable TICKS is checked to see if 0.5 seconds (by comparing the value in the TICKS variable to a predetermined value stored in a TGCNT variable) have elapsed. If the predetermined amount of time has elapsed, then, in step 568, the TICKS variable is cleared and DSP toggles the output pin on which the EQOFF* signal is generated, which signal drives the equalizer "on" LED 106 (see FIG. 2B). Then, in order to complete the "Test Mode" operation, in step 572, the "ERR" output variable is loaded with the value of input sample variable NEWSAM. In this manner the frequency response of the equalizer circuitry can be tested without any interference from the DSP 98 tone cancellation routine.

Then the routine proceeds, via off-page connectors 576, 579, 588 and 591 to step 598 where the ERR output variable is rounded to truncate the two least significant bits (LSBs) before restoring the result back into the "ERR" variable. Then, in step 599, the interrupt flag is cleared and the routine proceeds, via off-page connectors 592, 589, 580, 577, 556 and 548 back to step 528. As previously mentioned, the routine waits at step 528 until another FR framing interrupt is received indicating that a new input data word has been received for processing.

Returning back to step 558 (FIG. 2C), if the TSTMD flag is cleared to "0", indicating that the DSP 98 (see FIG. 2C) is not in "Test Mode", then the "Normal Cancellation" mode of operation will be performed. The routine proceeds to step 560 where the value of the TICKS variable is used to check the status of the filter coefficients. The coefficients status is checked once every 12.5 mS by comparing the value of the TICKS variable to a predetermined value stored in a COFCNT variable.

If the value of the TICKS variable is less than the predetermined value stored in the COFCNT variable, then the routine proceeds with feedback cancellation by proceeding, via off-page connectors 575 and 578, to step 581 (FIG. 5I)) as will hereinafter be described.

However, if, in step 560 (FIG. 5C), it is determined that 12.5 ms has elapsed (the value of the TICKS variable is equal to the value prestored in the COFCNT variable), then the routine will proceed to clear the TICKS variable in step 564, then the status of the filter coefficients is checked in step 570 for any abnormal situation. This checking routine is illustrated in FIG. 4I]. More particularly, the value of a "TEMP" variable is set equal to the absolute sum of the first eighteen filter coefficients as shown in step 570. Then in step 574, the value of the TEMP variable is checked to see if it exceeds a predetermined maximum value stored in the variable "MAXSUM". If in step 574, the value of the TEMP variable is greater than the predetermined maximum value in the variable MAXSUM, the routine will initialize the coefficients by proceeding, via off-page connectors 552, 550, 524 and 520, to the initialization routine beginning with step 502 (FIG. 5A) where all coefficients will be cleared (step 506) and all variables will be re-loaded (step 508). If, in step 574 (FIG. 5C), the value stored in variable TEMP does not exceed the predetermined maximum value stored in the variable MAXSUM, then the routine proceeds, via off-page connectors 575 and 578 to step 581 (FIG. 5E).

In step 581, pointers for the aforementioned 2-tap delay buffer are set up. Then, in step 582, the data in the 2-tap delay buffer is shifted to make room for the newly-received input sample now stored in the NEWSAM variable. In step 583, the new input sample is stored in the first data location of the buffer (designated as "DSTART").

Then, in step 584, a 32-tap FIR filter operation is performed using the process outlined in FIG. 4A. The FIR filter process produces an output data word (the estimated output feedback signal, y(k), as shown in FIG. 4A) which output data word is stored in a "FIROUT" variable in step 585. Then, proceeding to step 586, the aforementioned ERR output variable is calculated by subtracting the FIROUT variable from the input data sample stored in the NEWSAM variable. Then, via off-page connectors 587 and 590, the routine proceeds to step 593 (FIG. 5E) where the input for the FIR filter, stored in variable "FIRIN" is re-loaded for the next FIR filter operation, by setting the variable FIRIN equal to "FFSAM" (the first FIR Filter sample).

Figure 5A:
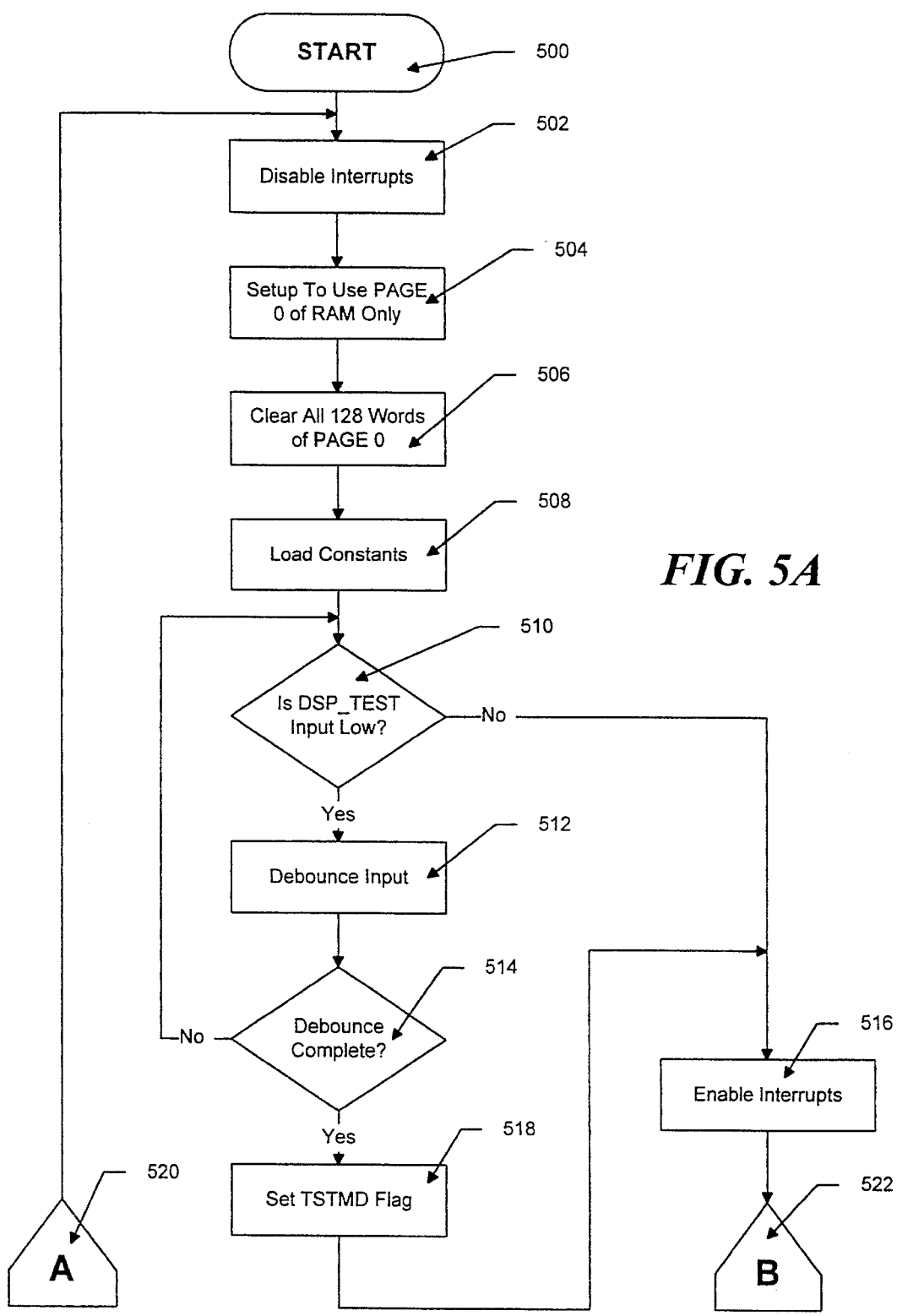
FIGS. 5A–5E, when placed together, form an illustrative flowchart of a cancellation routine and decision flow paths which might be used to implement a feedback cancellation routine on a DSP.
Figure 5B:
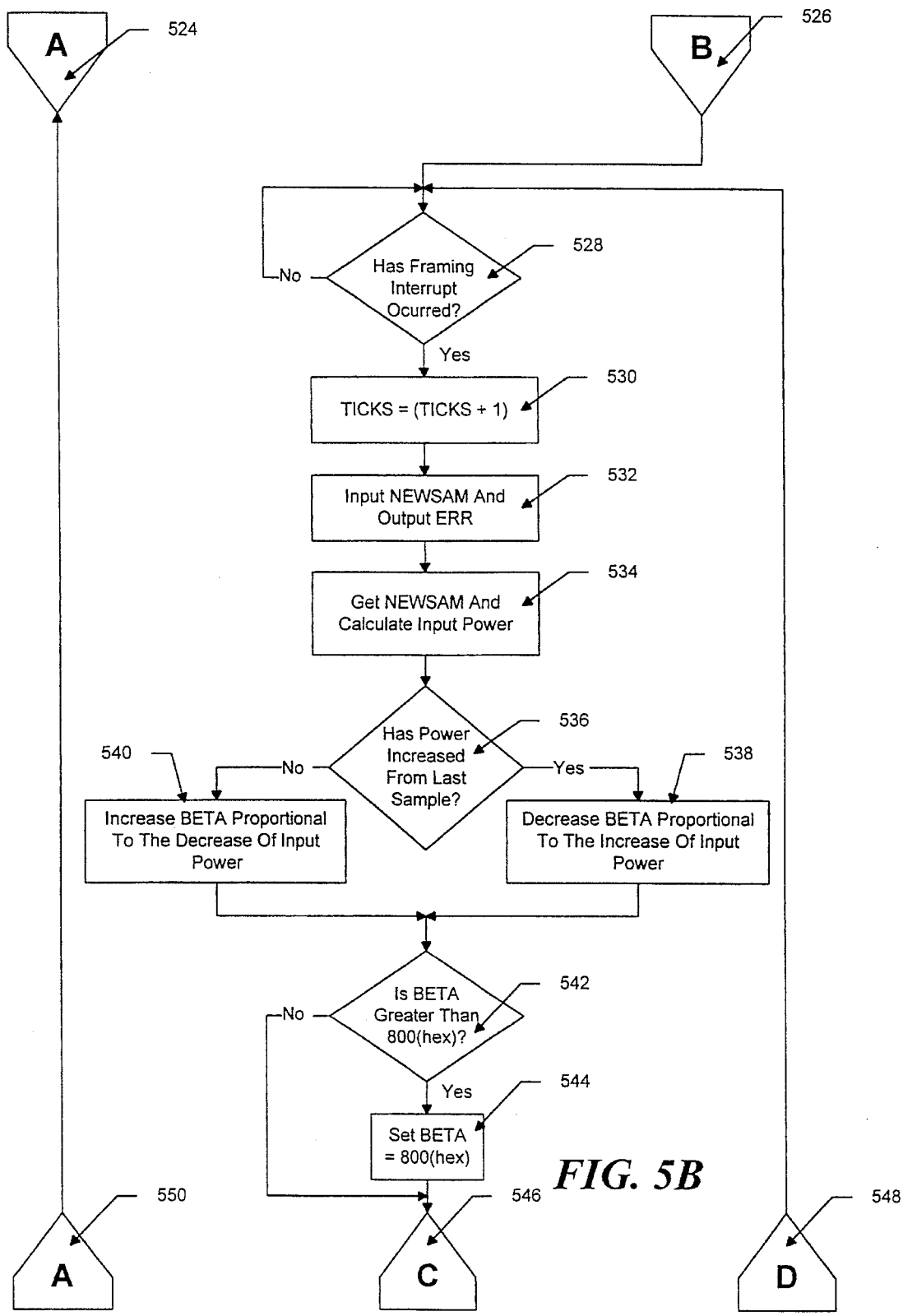
Figure 5C:
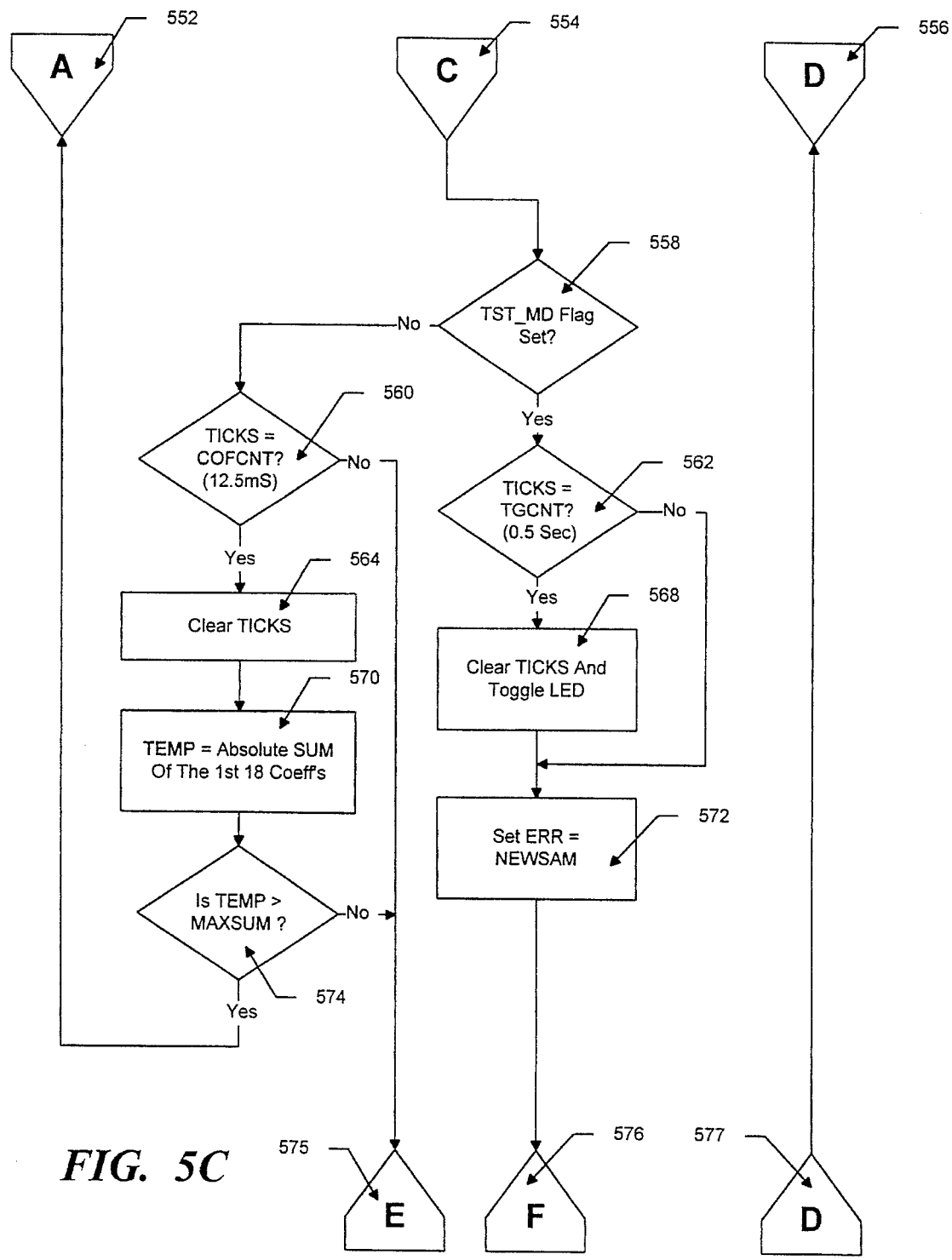
Figure 5D:
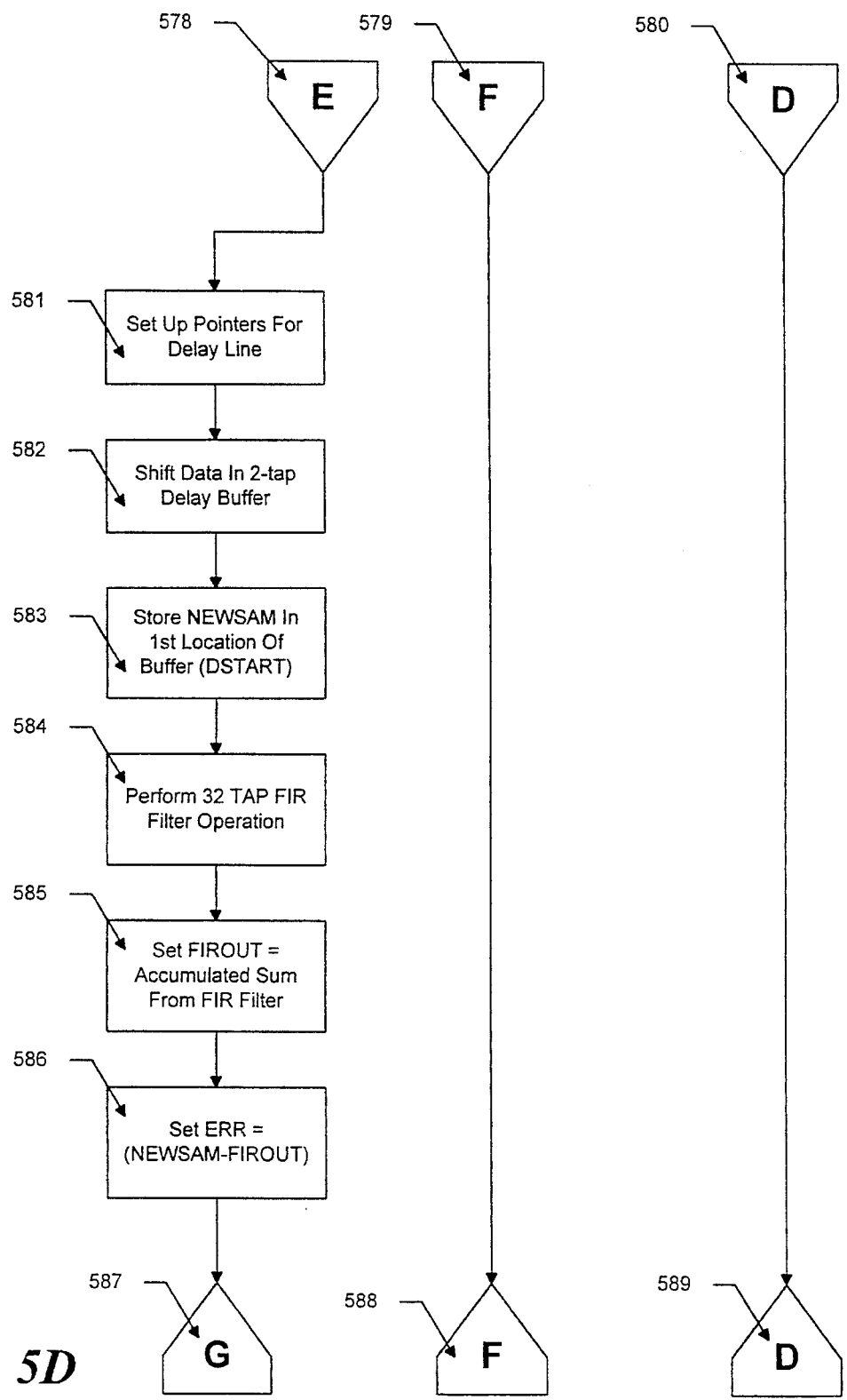
Figure 5E:
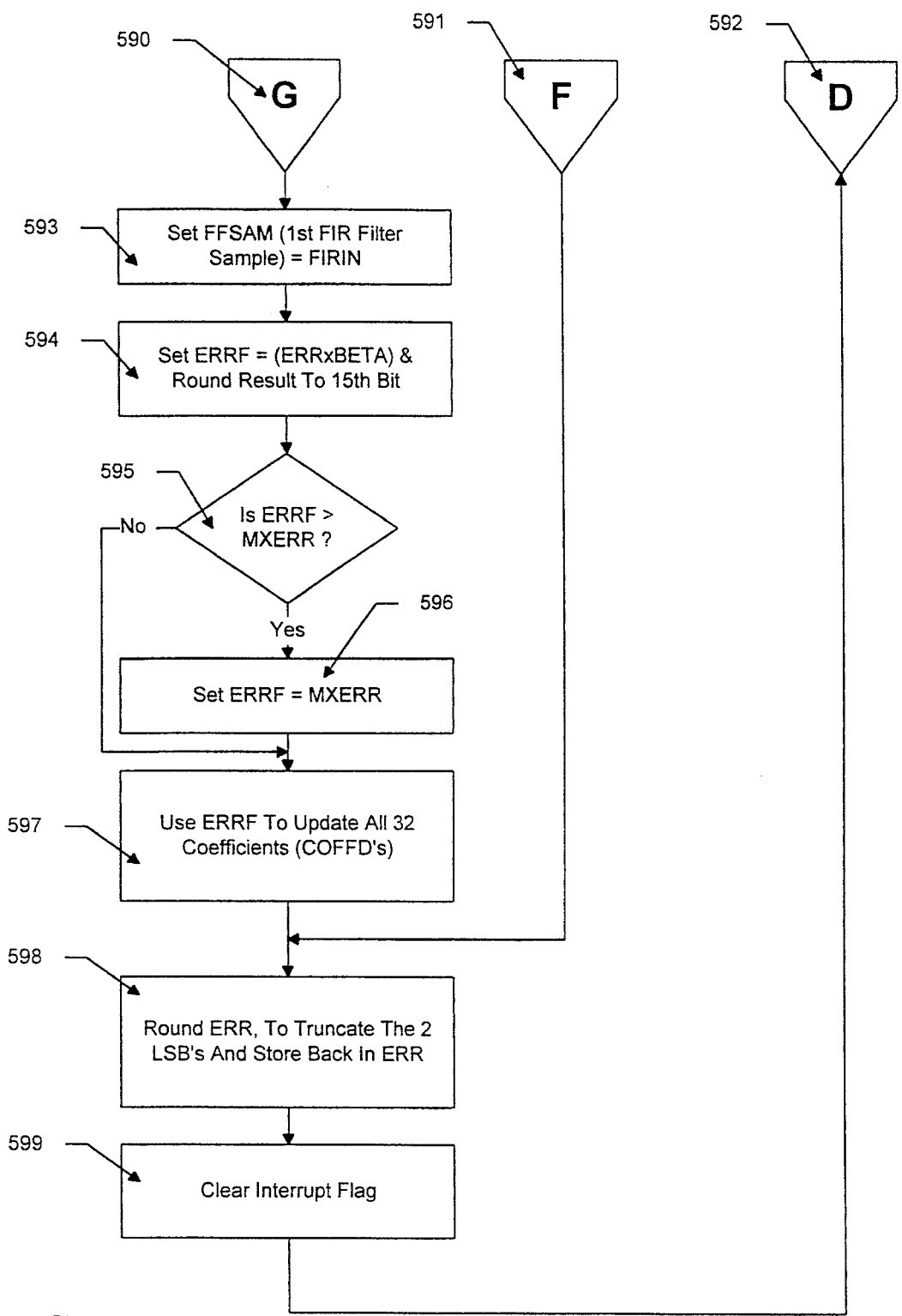

Next, in step 594, the routine calculates the adjustments needed for each of the 32 filter coefficients using the process illustrated in FIG. 4B and the variables "ERRF" and the convergence parameter "BETA" previously adjusted in steps 536–544 (FIG. 5B). In particular, the variable ERRF is set equal to the value of the output variable ERR multiplied by the convergence parameter variable value, BETA. The resulting product is then rounded to the 15th bit as set forth in step 594.

Proceeding to step 595, the value of variable ERRF is checked to see if it has exceeded a predetermined maximum value stored in the "MXERR" variable. This check is performed to keep the filter coefficients from changing too drastically between each sample and thereby increase the noise generated by the filter. If, in step 595, it is determined that the value of variable ERRF is less than the maximum value stored in the variable MXERR, then the routine proceeds to step 597. Alternatively, if the value of variable ERRF is greater than the maximum, MXERR, then, in step 596, the value of variable ERRF is set to equal to the maximum stored in MXERR and the routine proceeds to step 597.

In step 597 the value stored in the variable ERRF is used to update all 32 filter coefficients. Completing the feedback cancellation operations, the routine then proceeds to step 598, where the output sample stored in the ERR variable is rounded and stored back into the ERR variable for output to codec 96 (see FIG. 2C), on the next occurring "FR" framing interrupt. As mentioned previously, in step 599, the interrupt flag is cleared and operation resumes by returning to the FR framing interrupt wait loop starting in step 528 (FIG. 5B), via off-page connectors 592, 589, 580, 577, 556 and 548.

The terms and expressions employed hereinabove are used as terms of description and not meant to be limiting in any way. There is no intention to exclude any equivalents of the features shown and described or portions thereof. It should be recognized that various modifications are possible while remaining within the scope of the invention as claimed.

What is claimed is:

1. An acoustic feedback cancellation apparatus for use in an audio amplification system which receives an acoustically coupled input signal, comprising:

a notch filter responsive to the acoustically coupled input signal for selectively attenuating an input signal frequency component indicative of acoustically coupled feedback and for generating a filtered output signal;

a multi-band equalizer responsive to the filtered output signal for providing an equalizer output signal;

an amplifier which amplifies said equalizer output signal and provides an amplifier output signal; and adaptive apparatus responsive to the acoustically coupled input signal for tracking the frequency value of the input signal frequency component to be attenuated by the notch filter.

2. An acoustic feedback cancellation apparatus according to claim 1 wherein the notch filter comprises a digital finite impulse response filter having an input for receiving the input signal.

3. An acoustic feedback cancellation apparatus according to claim 2 wherein the frequency tracking apparatus further comprises apparatus responsive to the input signal for adapting the digital finite impulse response filter to minimize the input signal frequency component in the digital finite impulse response filter output.

4. An acoustic feedback cancellation apparatus according to claim 2 wherein the digital finite impulse response filter has a convergence parameter, and the digital finite impulse response filter further comprises:

apparatus responsive to the input signal for determining the input energy of the input signal; and apparatus responsive to the input energy for changing the convergence parameter so that noise generated by the digital finite impulse response filter is minimized.

5. An acoustic feedback cancellation apparatus according to claim 2 wherein the digital finite impulse response filter has a plurality of coefficient values and the digital finite impulse response filter further comprises apparatus for responsive to the plurality of coefficient values for generating a sum value of the plurality of coefficient values and apparatus responsive to the sum value for resetting the digital finite impulse response filter when the sum value exceeds a predetermined maximum sum value.

6. An acoustic feedback cancellation apparatus according to claim 1 further comprising apparatus connected between the input signal and the notch filter for delaying the input signal for a predetermined time interval.

7. An acoustic feedback cancellation apparatus according to claim 1 wherein the notch filter comprises a digital signal processor.

8. An audio amplification system which receives a discrete time input signal whose spectrum contains a plurality of frequency components indicative of both voice data and acoustically coupled noise, and which provides an amplified and equalized output signal, said amplification system comprising:

A) an acoustic feedback cancellation apparatus which attenuates frequency components associated with the acoustically coupled noise within the discrete time input signal frequency spectrum, said cancellation apparatus comprising;

i) a digital finite impulse response filter responsive to the discrete time input signal, and a plurality of filter coefficient weighting values wherein said filter is tuned to pass only the acoustically coupled noise within the frequency spectrum of said discrete time input signal, and for providing a filtered signal indicative of the acoustically coupled noise;

ii) a summer which computes the difference between said filtered signal and said discrete time input signal and provides a difference signal value indicative of the difference between said signals;

iii) an apparatus responsive to said difference signal value for computing said plurality of filter coefficient values to cause said digital finite impulse response filter to pass only energy associated with the unwanted acoustically coupled feedback within the frequency spectrum of said difference signal; and B) an adjustable acoustic equalizer responsive to said difference signal for providing an equalizer output signal.

9. The audio amplification system according to claim 8 wherein the digital finite impulse response filter has a convergence parameter, and the digital finite impulse response filter further comprises:

apparatus responsive to the discrete time input signal for determining the input energy of the discrete time input signal, and for providing an input energy value indicative thereof; and apparatus responsive to the input energy value for changing the convergence parameter so energy associated with the acoustically coupled noise is minimized within the frequency spectrum of the difference signal.

10. The audio amplification system according to claim 8 wherein the digital finite impulse response filter further comprises apparatus responsive to the plurality of filter coefficients for generating a sum value of the plurality of filter coefficients and apparatus responsive to the sum value for setting the filter coefficients to a predetermined value when the sum value exceeds a predetermined maximum sum value.

11. The audio amplification system according to claim 8 further comprising apparatus responsive to the discrete time input signal for delaying each time sample of the discrete time input signal for a predetermined time interval before the discrete time input signal is applied to the digital finite impulse response filter.

12. The audio amplification system according to claim 24 wherein the digital finite impulse response filter comprises a digital signal processor.

13. A telephone apparatus comprising:

a speaker for generating audible sounds;

a microphone responsive to audio sound signals for generating an analog input signal comprised of a plurality of signal components, the microphone being subject to acoustic feedback from the speaker;

an analog-to-digital converter responsive to the analog input signal for generating a plurality of digital words representing the analog input signal;

a digital finite impulse response filter having an input for receiving the plurality of digital words, a plurality of filter coefficients and an output;

subtraction apparatus responsive to the plurality of digital words and to the finite impulse response output for generating a plurality of digital estimation signal words;

apparatus responsive to the plurality of digital estimation signal words for adjusting the filter coefficients to cause the finite impulse response filter to selectively remove an input signal periodic component in the finite impulse response filter output;

a digital-to-analog converter responsive to the plurality of digital estimation signal words for generating an analog processed signal;

a multi-band equalizer responsive to the analog processed signal for emphasizing selective frequencies in the analog processed signal and for amplifying the analog processed signal to produce an output signal for driving the speaker.

14. A telephone apparatus according to claim 13 wherein the finite impulse response filter has a convergence parameter, and the finite impulse response filter further comprises:

apparatus responsive to the plurality of digital words for determining the input energy of the plurality of digital words; and apparatus responsive to the input energy for changing the convergence parameter so that noise generated by the finite impulse response filter is minimized.

15. A telephone apparatus according to claim 14 wherein the finite impulse response filter further comprises apparatus for responsive to the plurality of filter coefficients for generating a sum value of the plurality of filter coefficients and apparatus responsive to the sum value for setting the filter coefficients to a predetermined value when the sum value exceeds a predetermined maximum sum value.

16. A telephone apparatus according to claim 15 further comprising apparatus responsive to the plurality of digital words for delaying each of the plurality of digital words for a predetermined time interval before the plurality of digital words is applied to the finite impulse response filter.

17. A telephone apparatus according to claim 16 wherein the digital finite impulse response filter comprises a digital signal processor.

18. A method for canceling acoustic feedback for use in an audio amplification system having an analog input signal comprised of a plurality of signal components, apparatus responsive to the analog input signal for generating a plurality of digital words representing the analog input signal, apparatus responsive to the plurality of digital words for generating an analog processed signal and an amplifier for amplifying the analog processed signal to produce an output signal, the input signal being subject to acoustic feedback from the output signal, the method comprising the steps of:

A. applying the plurality of digital words to a digital finite impulse response filter having an input for receiving the plurality of digital words, a plurality of filter coefficients and an output;

B. subtracting the finite impulse response output from the plurality of digital words to generate an estimation signal;

C. providing the estimation signal to the amplifier;

D. using the estimation signal to adjust the filter coefficients to cause the finite impulse response filter to selectively remove an input signal periodic component in the finite impulse response filter output; and D1. balancing the frequency content of the finite impulse response output with a multiband equalizer.

19. A method for canceling acoustic feedback according to claim 18 wherein the finite impulse response filter has a convergence parameter, and the method further comprises the steps of:

E. determining the input energy of the plurality of digital words; and

F. using the input energy determined in step E to change the convergence parameter so that noise generated by the finite impulse response filter is minimized.

20. A method for canceling acoustic feedback according to claim 19 further comprising the steps of:

G. generating a sum value of the plurality of filter coefficients; and

H. setting the filter coefficients to a predetermined value when the sum value generated in step G exceeds a predetermined maximum sum value.

21. A method for canceling acoustic feedback according to claim 20 further comprising the step of:

I. delaying each of the plurality of digital words for a predetermined time interval before the plurality of digital words is applied to the finite impulse response filter.

* * * * *